United States Patent [19]

Shinkai et al.

[11] Patent Number: 4,720,442
[45] Date of Patent: Jan. 19, 1988

[54] PHOTOMASK BLANK AND PHOTOMASK

[75] Inventors: Norihiko Shinkai, Kanagawa; Takeshi Haranoh, Yokohama; Junetsu Kanazawa, Yokohama; Takashi Hatano, Yokohama, all of Japan

[73] Assignee: Asahi Glass Company Ltd., Tokyo, Japan

[21] Appl. No.: 866,926

[22] Filed: May 27, 1986

[30] Foreign Application Priority Data

May 28, 1985 [JP] Japan .................. 60-113124

[51] Int. Cl.$^4$ .............. G03F 9/00; B32B 17/06
[52] U.S. Cl. ...................... 430/5; 428/432; 428/427; 428/698; 428/699; 428/701
[58] Field of Search ............. 430/5, 321; 428/698, 428/432, 427, 701, 704, 699

[56] References Cited

U.S. PATENT DOCUMENTS

| | | | |
|---|---|---|---|
| 4,363,846 | 12/1982 | Kaneki | 428/203 |
| 4,374,912 | 2/1983 | Kaneki et al. | 430/5 |
| 4,497,878 | 2/1985 | Hatano et al. | 428/698 |
| 4,530,891 | 7/1985 | Nagarekawa et al. | 430/5 |
| 4,563,407 | 1/1986 | Matsui et al. | 430/5 |

FOREIGN PATENT DOCUMENTS

| | | | |
|---|---|---|---|
| 59-90852 | 5/1984 | Japan | 430/5 |
| 60-182439 | 9/1985 | Japan | 430/5 |

Primary Examiner—John E. Kittle
Assistant Examiner—José G. Dees
Attorney, Agent, or Firm—Oblon, Fisher, Spivak, McClelland, & Maier

[57] ABSTRACT

A photomask blank comprising a transparent substrate and at least two layers including a masking layer and an antireflection layer, formed thereon, wherein said masking layer is a chromium masking layer containing more than 25% by atomic ratio of nitrogen, and said antireflection layer is a chromium oxide antireflection layer containing more than 25% by atomic ratio of nitrogen.

12 Claims, 12 Drawing Figures

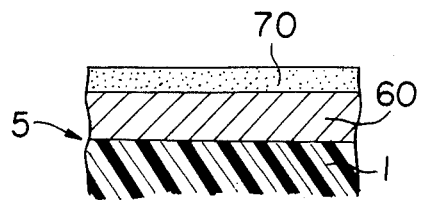
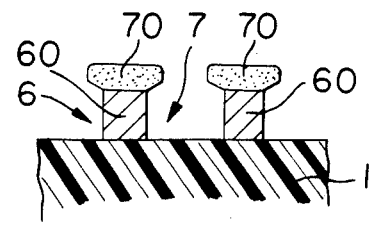
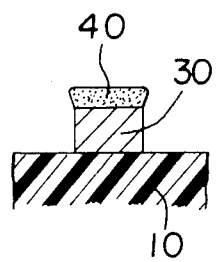 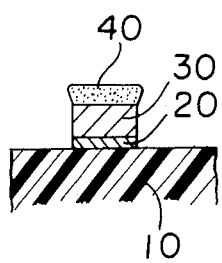 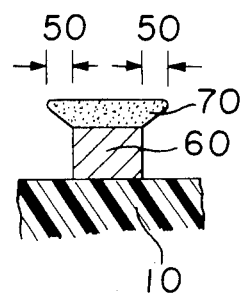
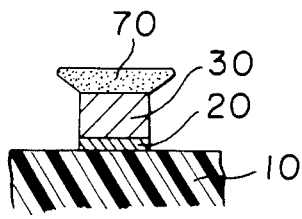

PHOTOMASK BLANK AND PHOTOMASK

BACKGROUND OF THE INVENTION

1. FIELD OF THE INVENTION

The present invention relates to photomask blanks and photomasks for use in the production of semiconductors or the like.

2. DESCRIPTION OF THE PRIOR ART

In the production of semiconductors such as integrated circuits (IC) or large-scale integrated circuits (LSI), elements are produced by optical or electron beam lithography wherein a photomask formed with a chromium layer is used as a hard mask plate with high-resolution in order to form a circuit image on a silicon wafer with high precision. As such a photomask, it is common to employ a single layer type photomask comprising a single chromium masking layer formed on a transparent substrate, or a double layer type photomask wherein a layer of chromium oxide is formed for antireflection on the single layer type photomask to reduce the reflectance of the single layer type photomask which usually has a high surface reflectance.

For the preparation of a photomask used for the production of semiconductors from a photomask blank, a photo-sensitive or electron-sensitive resist layer is coated on the photomask blank, and then a predetermined pattern is exposed by an exposure apparatus, followed by development treatment of the resist, and then the exposed chromium layer portions are subjected to etching to obtain a desired pattern. Therefore, the chromium masking layer as a masking material is required to have excellent etching properties so that it is capable of forming a fine or minute pattern.

Further, the chromium masking layer as a masking material is required to have, in addition to the optical properties and etching properties, good durability, particularly chemical durability against a cleaning solution such as a strong acid, and good adhesion to the glass substrate. Japanese Unexamined Patent Publication No. 31336/1983 proposes to introduce a nitrogen component into the chromium masking layer to improve the chemical durability. However, the durability is inadequate against a strong acid cleaning solution represented by e.g. hot concentrated sulfuric acid. Further, it has been proposed to reduce the etching speed by introducing a carbon component into the masking layer (Japanese Unexamined Patent Publication No. 151945/1982, and U.S. Pat. No. 4,530,891). However, this proposal has drawbacks such that chromium carbide has poor chemical resistance and tends to lower the adhesion to the glass substrate.

On the other hand, a chromium oxide layer as an antireflection layer usually has a drawback that the etching speed is usually slower than that in the case of the chromium layer as the masking layer, and, as shown in FIG. 11, an overhang 50 is likely to form in the cross section of the pattern, whereby the precision for a fine pattern tends to deteriorate. Namely, if the overhang is formed along the pattern edges in a thickness of from 200 to 300Å, it is susceptible to breakage, and in various cleaning operations during the preparation or use of the mask, discontinuous burrs or mouse nip like defects are likely to form along the pattern edges, whereby the precision of the pattern tends to deteriorate. Further, microscopically, the overhang along the periphery of the masking pattern means that the optical density along the pattern edges tends to have a gradient, whereby the dimensional value at the time of transfer tends to be readily affected by the exposure condition. It has been proposed to introduce nitrogen into the chromium oxide layer to eliminate such drawbacks (see Japanese Unexamined Patent Publication No. 104141/1972). However, the composition of the layer is not still fully satisfactory in view of the degree of overhang, and a further improvement is desired.

SUMMARY OF THE INVENTION

It is an object of the present invention to overcome the drawbacks inherent to the conventional techniques. Namely, it is an object of the present invention to improve the adhesion between the glass substrate and the chromium layer, to improve the chemical durability against a cleaning solution such as a strong acid, to minimize the formation of the overhang due to etching, to minimize the remainder of the chromium layer due to fine dusts deposited on the resist coating, and to provide a low reflectance.

The present invention provides a novel photomask blank and photomask having durability with the above improvements and excellent etching properties. Namely, according to the first aspect, the present invention provides a photomask blank comprising a transparent substrate and at least two layers including a masking layer and an antireflection layer, formed thereon, wherein said masking layer is a chromium masking layer containing more than 25% by atomic ratio of nitrogen, and said antireflection layer is a chromium oxide antireflection layer containing more than 25% by atomic ratio of nitrogen. According to the second aspect, the present invention provides a photomask comprising a transparent substrate and at least two patternized layers including a patternized masking layer and a patternized antireflection layer, formed thereon, wherein said masking layer is a chromium masking layer containing more than 25% by atomic ratio of nitrogen, and said antireflection layer is a chromium oxide antireflection layer containing more than 25% by atomic ratio of nitrogen.

Here, the photomask blank of the present invention has at least two layers including a masking layer and an antireflection layer formed on a transparent substrate, and thus may have more than two layers, and the masking layer is not always directly formed on the transparent substrate.

BRIEF DESCRIPTION OF THE DRAWINGS

FIG. 7 is a cross-sectional view of a conventional photomask blank.

FIG. 8 is a cross-sectional view of a conventional photomask.

FIGS. 9 and 10 illustrate the overhang in the case of the present invention.

FIGS. 11 and 12 illustrate the overhang in the case of conventional products.

DETAILED DESCRIPTION OF THE PREFERRED EMBODIMENTS

Figure 1:
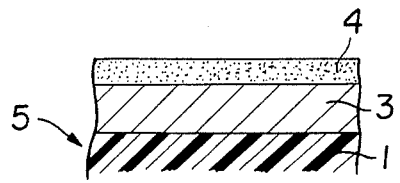
FIGS. 1, 3 and 5 are cross-sectional views of photomask blanks of the present invention.
Figure 2:
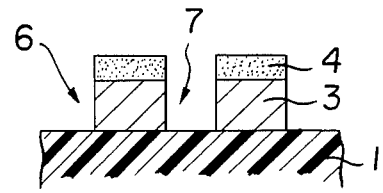
FIGS. 2, 4 and 6 are cross-sectional views of photomasks of the present invention.
Figure 3:
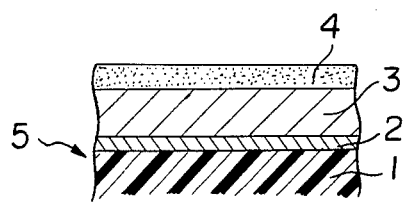
Figure 4:
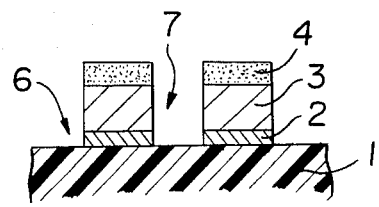
Figure 5:
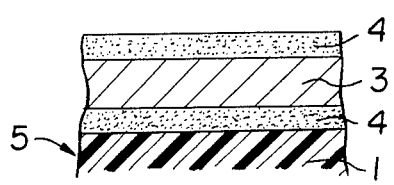
Figure 6:
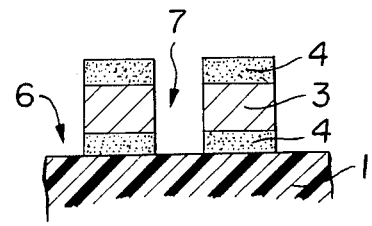

FIGS. 1, 3 and 5 illustrate cross-sectional structures of photomask blanks of the present invention. FIGS. 2, 4 and 6 illustrate cross-sectional structures of photomasks obtained by patterning the photomask blanks of FIGS. 1, 3 and 5, respectively. In the Figures, reference numeral 1 indicates a transparent substrate such as a glass substrate, numeral 2 indicates an underlayer, numeral 3 indicates a chromium masking layer containing more than 25% by atomic ratio of nitrogen, numeral 4 indicates a chromium oxide antireflection layer containing more than 25% by atomic ratio of nitrogen, numeral 5 indicates a photomask blank, numeral 6 indicates a photomask, and numeral 7 indicates a void portion of the patternized photomask formed by removing the above-mentioned layers by patterning.

The basic structure of a conventional photomask blank is as shown in FIG. 7. Namely, it comprises a masking layer 60 formed as a first layer on a glass substrate 1 as a transparent substrate, and a chromium oxide layer 70 formed as an antireflection layer on the first layer. Here, a carbon component is introduced in the masking layer 60 formed on the glass substrate 1 to minimize the undercut i.e. the narrowing of pattern line caused by excessive etching. However, because of the incorporation of carbon, this masking layer has a poor adhesion to the glass substrate, and it is inferior in the durability against a strong acid used as a cleaning solution.

Whereas, in the present invention, a nitrogen-containing chromium layer 3 having a strong adhesion to the glass substrate and excellent chemical durability, is formed as the masking layer on the transparent substrate, as shown in FIG. 1. In another embodiment, a nitrogen-containing chromium layer 2 is formed as an underlayer between the above-mentioned nitrogen-containing chromium layer 3 as the masking layer and the transparent substrate 1, as shown in FIG. 3. In a further preferred embodiment of the present invention, the nitrogen content in each of the masking layer and the underlayer is more than 25% by atomic ratio, whereby the above-mentioned improvements can particularly effectively be accomplished. Namely, the object of the present invention can adequately be accomplished whether the layer formed on the transparent substrate is a masking layer or an underlayer so long as it is composed of chromium and nitrogen. Here, the nitrogen content is preferably more than 25%, preferably more than 25 and not more than 50%, more preferably from 30 to 50%, by atomic ratio, to obtain adequate chemical durability. In a two component chromium layer comprising chromium and nitrogen, the nitrogen content may be not more than 50% by atomic ratio. If the two component layer composition is represented by $CrN_x$, the nitrogen content in the underlayer 2 is preferably $x=$more than 0.33 to 1.0, particularly from 0.43 to 1.0. On the other hand, the nitrogen content in the chromium masking layer formed on the underlayer (FIG. 3) or in the chromium masking layer formed on the transparent substrate (FIG. 1) is more than 25%, preferably more than 25 to not more than 50%, particularly from 30 to 50%, by atomic ratio, to obtain adequate chemical resistance.

In the case where the nitrogen-containing chromium masking layer 3 is a three component layer comprising nitrogen, boron and chromium, not only the nitrogen content but also the boron content is important from the viewpoint of the etching properties. With respect to the effects of boron, the etching speed lowers as the boron content increases unless no substantial change is involved in the structure of the layer thereby obtained. However, the etchant used in this case is an aqueous solution obtained by mixing cerium (IV) ammonium nitrate and perchloric acid commonly used in wet etching, and pure water in predetermined concentrations. In the present invention, it has been found that in order to obtain the desired etching properties (such as the etching speed, undercut, etc.) for the masking material as a photomask, the boron content should preferably be within a certain range.

Like carbon, boron is capable of controlling the decrease in the etching speed by adjusting the amount contained in the chromium masking layer, and it plays an important role to minimize the undercut. The larger the boron content in the layer is, the lower the etching speed of the layer becomes, and the smaller the undercut becomes, but the longer becomes the etching time. The etching time should be in a proper range, and can be a problem when it is too short or too long. For instance, if the etching time is too short, the undercut will be great, and the irregularity in the mask pattern line width due to the variation of the etching time tends to increase, whereby it becomes difficult to control the line width. On the other hand, if the etching time is too long, the productivity becomes poor, and a greater amount of the etching solution (i.e. the etchant) is consumed, thus leading to an economical disadvantage. The etching time is usually from 20 to 90 seconds, preferably from 30 to 60 seconds. Thus, the etching time is a factor for the determination of the amount of boron incorporated in the chromium masking layer.

A two component chromium boride masking layer obtained by incorporating boron into metal chromium, is inferior in the chemical durability. For instance, it is soluble in a strong acid, particularly in hot concentrated sulfuric acid. Namely, so long as the chemical durability is concerned, boron provides no contribution to metal chromium having poor chemical durability. Therefore, in order to improve the chemical durability, it is essential to incorporate nitrogen in an amount of more than 25%. Here, the relation between the amount (% by atomic ratio) of boron incorporated into a chromium masking layer containing 30% by atomic ratio of nitrogen and having excellent chemical durability and the etching speed (Å/sec) of the chromium masking layer, was investigated. As the result, the etching speeds at the boron contents of 1, 3, 5, 8 and 10% by atomic ratio, were 45, 30, 15, 10 and 8 Å/sec, respectively. From this result, if the thickness of the chromium masking layer containing 30% by atomic ratio of nitrogen is 1000 Å, the etching speed for the etching time within a range of from 20 to 90 seconds will be within a range of from 50 to 11 Å/sec, and the boron content in the chromium masking layer will be from 1 to 10% by atomic ratio. From the viewpoint of the etching time as above, in the chromium masking layer formed on the underlayer or in the chromium masking layer formed on the transparent substrate, the boron content against a nitrogen content of from more than 25 to 50% by atomic ratio, is preferably from 1 to 20% by atomic ratio, more preferably from 1 to 10% by atomic ratio. Namely, the amount of boron contained in the chromium masking layer is preferably from 1 to 20% by atomic ratio. Accordingly, if the three component chromium masking layer 3 comprising Cr, N and B, is represented by $CrN_xB_y$, x is within a range of $0.34 < x < 1.67$, and y is within a range of $0.014 < y < 0.67$, to adequately accomplish the object of the present invention. The respective minimum values of 0.34 and 0.014 in the above ranges of x and y, are determined by the chemical durability and by the etching speed, respectively. With respect to the maximum values of $x=1.67$ and $y=0.67$, nitrogen or boron may be incorporated in an excess amount depending upon the coating conditions, but there is no particular merit in doing so, for the properties as the masking material. For this reason, the upper limits are defined to be $x<1.67$ and $y<0.67$. However, the upper limits are not critical, and a certain excess amount such as $x=1.7$ or $y=0.70$ is acceptable.

In the foregoing, the chromium masking layer has been described with respect to a chromium layer containing boron and nitrogen. However, similar effects are obtainable by the incorporation of carbon instead of boron. Namely, the etching speed decreases as the carbon content in the chromium masking layer increases. However, a two component system of chromium carbide is inferior in the chemical durability, particularly the durability against a strong acid, and it is necessary to incorporate more than 25% by atomic ratio of nitrogen into the layer, as in the case of boron. In the same manner as in the case of boron, the relation between the carbon content by atomic ratio in the chromium masking layer containing 30% by atomic ratio of nitrogen and the etching time for the layer thickness of 1000 Å, was obtained, whereby it was found that the carbon content is from 5 to 30% by atomic ratio at an etching time of from 20 to 90 sec., i.e. at an etching speed of from 50 to 11 Å/sec. If the carbon content is less than 5% by atomic ratio, no substantial decrease in the etching speed is observed. On the other hand, if the carbon content exceeds 30% by atomic ratio, not only the etching time will be long, but also the lowering of the optical density occurs, the layer thickness to satisfy an optical density of 3.0 (at wavelength=436 nm) tends to be thick, and the etching time will be prolonged. Thus, the carbon content has a proper range to satisfy the etching properties (such as the etching speed, undercut, etc.) of the masking material desired for a photomask. Namely, the amount of carbon contained in the chromium masking layer is from 5 to 30% by atomic ratio. Accordingly, if the composition of the three component chromium masking layer 3 comprising Cr, N and C is represented by $CrN_xC_y$, x is within a range of $0.36<x<1.00$, and y is within a range of $0.07<y<0.67$. The respective minimum values of 0.36 and 0.07 in the above ranges of x and y, are determined by the chemical durability and by the etching speed, respectively. With respect to the maximum values of $x=1.00$ and $y=0.67$, it is possible to incorporate an excess amount of nitrogen or carbon depending upon the coating conditions, but no additional improvement is thereby observed in the properties as the masking material. Thus, the upper limits are defined to be $x<1.00$ and $y<0.67$. However, a certain excess amount such as $x=1.05$ or $y=0.70$ may be acceptable.

Further, the above-mentioned underlayer and masking layer may contain not more than 10% by atomic ratio of other components such as oxygen.

The antireflection layer 4 in the present invention is a chromium oxide layer containing nitrogen. The amount of nitrogen contained in this layer is more than 25%, preferably more than 25 to not more than 40%, by atomic ratio and particularly preferred for minimizing the overhang and reducing the reflectance to a low level, is more than 25 and not more than 35%, by atomic ratio. Whereas, the amount of chromium in the antireflection layer is preferably from 40 to 55% by atomic ratio, and the amount of oxygen is preferably from 25 to 40% by atomic ratio. If the amount of nitrogen is 25% or less by atomic ratio, the etching speed will not be improved, whereby an overhang is likely to form, such being undesirable. On the other hand, if the amount of nitrogen exceeds 40% by atomic ratio, the antireflection properties tend to deteriorate, such being undesirable. Namely, in order to obtain a low reflectance, the oxygen content in the nitrogen-containing chromium oxide layer plays an important role, and if oxygen is less than 25% by atomic ratio, the low reflectance tends to be lost. Accordingly, it is not advantageous to increase the nitrogen content beyond 60% by atomic ratio.

The present invention provides also a photomask blank wherein the above-mentioned chromium oxide antireflection layer is formed on the transparent substrate and beneath the chromium masking layer containing more than 25% by atomic ratio of nitrogen, and the above-mentioned chromium oxide antireflection layer is formed also on the chromium masking layer. When the masking layer is used alone, the reflectance is about from 55 to 65% (at wavelength=436 nm). Whereas, when the antireflection layer is formed on each side of the masking layer, the reflectance is reduced to a level of from 5 to 20% on each side.

In the present invention, the thickness of the chromium masking layer formed directly on the transparent substrate, is preferably within a range of from 500 to 1500 Å from the viewpoint of the masking properties, etching properties and acid resistance. In such a case, the thickness of the antireflection layer is preferably within a range of from 150 to 500 Å. Further, the thickness of the underlayer in the present invention is preferably within a range of from 50 to 300 Å to minimize the undercut.

As the transparent substrate, a substrate having high transparency with a smooth and flat surface made of e.g. aluminosilicate glass, borosilicate glass, synthetic quartz glass, soda-lime glass or sapphire may be mentioned. The thickness of such a substrate is usually from 1 to 5 mm.

As the method for forming a chromium layer containing nitrogen, boron, oxygen or carbon according to the present invention, there may be mentioned a method of forming a layer by sputtering by using a target prepared by mixing and sintering powders of chromium metal and chromium nitride, chromium boride, chromium oxide or chromium carbide, a method of forming a layer by reactive sputtering by using a chromium metal target and a gas prepared by mixing nitrogen gas, diborane gas, oxygen gas or methane gas to argon gas, or a method of forming a layer by a combination of the above two methods, for instance, a method in which sputtering is conducted by using a target of chromium boride in a gas mixture of nitrogen gas and argon gas, or a method wherein sputtering is conducted by using a target of chromium carbide in a gas mixture of nitrogen gas, oxygen gas and argon gas. It is also possible to use the same type of target for the formation of both the masking layer and the antireflection layer. For instance, firstly a boron-containing chromium masking layer is formed on a transparent substrate by a method wherein sputtering is conducted by using a target of chromium boride in a gas mixture of nitrogen gas and argon gas, and then a nitrogen-containing chromium oxide antireflection layer is formed on the chromium masking layer by a method wherein sputtering is conducted by using the above-mentioned target of chromium boride in a gas mixture prepared by introducing oxygen gas into the above-mentioned gas mixture of nitrogen gas and argon gas. In this case, boron will be contained in the chromium oxide antireflection layer, but it does not adversely affect the coating properties of the photomask blank. This method provides an advantage that both the masking layer and the antireflection layer are formed by one type of target. The same applies to the case where a target of chromium carbide is employed. The amount of each element introduced into the chromium layer can be adjusted by controlling e.g. the composition ratio of the target, the mixing ratio of gases and the amount of the sputtering gas to be introduced.

Now, the present invention will be described in further detail with reference to Examples. However, it should be understood that the present invention is by no means restricted by these specific Examples.

EXAMPLES

Each sample was prepared by sputtering wherein a sputtering gas as identified in Table 1 was introduced to a low thermal expansion aluminosilicate glass substrate (5 inch×5 inch, thickness: 2.3 mm) having a thoroughly polished surface by using a chromium metal target. In the case of sample 3, a target prepared by mixing and sintering powders of chromium metal and chromium boride to bring the atomic ratio of Cr:B to 9:1, was employed instead of the chromium metal target. Table 1 shows the compositions of layers, the acid resistance, the adhesion and the overhang of each sample. The sputtering was conducted by using a gas obtained by mixing a proper amount of argon gas to the reaction gas having the composition ratio as identified in Table 1.

The acid resistance was determined by examining the chromium layer to see if it was dissolved after dipping the sample in concentrated sulfuric acid at 120° C. for 120 minutes. The adhesion of chromium layer was determined by rubbing the sample with an eraser containing silica sand attached to a scratch tester (HEIDON-18, manufactured by Shinto Kagaku Co., Ltd.) and evaluating the peeling of the coating. The overhang was determined from a cross section of a line pattern having a line width of 2 μm formed by a well-known photolithography. The photo resist used was OFPR-800 manufactured by Tokyo Ooka Kogyo Co., Ltd., and the thickness of the resist layer was 0.5 μm. The etchant was prepared by adding 43 cc of 70% perchloric acid to 165 g of cerium (IV) ammonium nitrate, and further adding deionized water to bring the total volume to 1000 cc. The temperature of the etchant was kept at 23° C., and the etching time was taken as a total of the clear time for each sample plus 30% of the clear time. The mask thus prepared was cut, and the cross-section of the chromium layer with a width of 2 μm was observed by a field emission type scanning electron microscope (FESEM) to determine the overhang.

It is evident from the results in Table 1 that with respect to the underlayer, from the comparison of sample 2 with sample 7, the one having the underlayer is superior in both the adhesion and the acid resistance to the conventional product containing carbon. Sample 6 contains a certain amount of nitrogen in the masking layer, and it shows some improvement in the adhesion, but the acid resistance is still inadequate. With respect to the masking layer, from the comparison of sample 1 with sample 4, it is evident that the acid resistance is improved by incorporating nitrogen in an amount of about 30% by atomic ratio, and from the comparison of sample 1 with samples 2 and 3, it is evident that when nitrogen and boron or nitrogen and carbon are incorporated, substantially the same results as in the case where nitrogen alone is incorporated (sample 1), are obtainable. With respect to the antireflection layer, from the comparison of sample 3 with samples 5, 6 and 7, it is evident that the larger the nitrogen content in the layer, the less the overhang, and that the overhang can be substantially eliminated when the nitrogen content is about 30% by atomic ratio.

As is evident from the foregoing, according to the present invention, the mechanical durability and chemical durability can be improved over the conventional products by providing the underlayer, and it is possible to provide photomask blanks and photomasks having excellent patternizing properties and chemical durability by specifying the masking layer and the composition of the upper layer.

TABLE 1

| | | Composition ratio of the reaction gas | | Inert gas | Composition of layer (% by atomic ratio) | | | | | Acid[1] resistance | Ad-hesion[2] | Overhang (μm) |
|---|---|---|---|---|---|---|---|---|---|---|---|---|
| | | $N_2/(N_2 + O_2)$ | $CH_4/(N_2 + CH_4)$ | | Cr | N | O | C | B | | | |
| Sample 1 (Present invention) | Underlayer | — | — | Ar | — | — | — | — | — | — | O | <0.02 (see FIG. 9) |
| | Masking layer | 1.0 | 0 | | 73 | 27 | — | — | — | O | | |
| | Antireflection layer | 0.95 | — | | 40 | 31 | 29 | — | — | O | | |
| Sample 2 (Present invention) | Underlayer | 1.0 | — | Ar | 66 | 34 | — | — | — | O | O | <0.02 (see FIG. 10) |
| | Masking layer | 1.0 | 0.2 | | 54 | 30 | — | 16 | — | O | | |
| | Antireflection layer | 0.95 | — | | 40 | 31 | 29 | — | — | O | | |
| Sample 3 (Present invention) | Underlayer | 1.0 | — | Ar | 66 | 34 | — | — | — | O | O | <0.02 (see FIG. 10) |
| | Masking layer[3] | 1.0 | — | | 63 | 29 | — | — | 8 | O | | |
| | Antireflection layer | 0.95 | — | | 40 | 31 | 29 | — | — | O | | |
| Sample 4 (Comparative example) | Underlayer | — | — | Ar | — | — | — | — | — | — | O | <0.02 (see FIG. 9 wherein masking layer 30 is replaced by 60.) |
| | Masking layer | 1.0 | 0 | | 86 | 14 | — | — | — | X | | |
| | Antireflection layer | 0.95 | — | | 40 | 31 | 29 | — | — | O | | |
| Sample 5 (Comparative example) | Underlayer | 1.0 | — | Ar | 66 | 34 | — | — | — | O | O | 0.10 (see FIG. 12) |
| | Masking layer | 1.0 | 0.2 | | 54 | 30 | — | 16 | — | O | | |
| | Antireflection layer | 0.82 | — | | 46 | 10 | 44 | — | — | Δ | | |
| Sample 6 (Conventional type 1) | Masking layer | 1.0 | 0.25 | Ar | 69 | 16 | — | 15 | — | X | Δ | 0.13 (see FIG. 11) |
| | Antireflection layer | 0.78 | — | | 51 | 3 | 46 | — | — | Δ | | |
| Sample 7 | Masking layer | — | 1.0 | Ar | 79 | — | — | 21 | — | X | X | 0.15 |

TABLE 1-continued

| | | Composition ratio of the reaction gas | | Inert gas | Composition of layer (% by atomic ratio) | | | | | Acid[1] resistance | Adhesion[2] | Overhang (μm) |
|---|---|---|---|---|---|---|---|---|---|---|---|---|
| | | $N_2/(N_2 + O_2)$ | $CH_4/(N_2 + CH_4)$ | | Cr | N | O | C | B | | | |
| (Conventional type 2) | Antireflection layer | 0.78 | — | | 51 | 3 | 46 | — | — | Δ | | (see FIG. 11) |

[1]The sample was dipped in concentrated sulfuric acid at 120° C. for 120 minutes.
X: The layer was dissolved.
Δ: Surface reflectance was remarkably increased.
○: Dissolution of the layer was not appreciable.
[2]The sample was rubbed with an eraser containing silica sand (5 mm in diameter) 10 times under a load of 500 g at a speed of 50 mm/min.
X: Peeling of the layer was observed.
Δ: Pin holes were formed.
○: No peeling or no pin hole was observed.
[3]Target: Cr/B = 9/1

As described in the foregoing, according to the present invention, it is possible to obtain photomask blanks and photomasks having excellent optical properties, mechanical properties and chemical durability by forming a chromium masking layer containing more than 25% by atomic ratio of nitrogen on a transparent substrate and forming a chromium oxide antireflection layer containing more than 25% by atomic ratio of nitrogen thereon.

Further, according to the present invention, it is possible to obtain photomask blanks and photomasks having excellent optical properties, mechanical properties and chemical durability by providing a nitrogen-containing chromium layer containing more than 25% by atomic ratio of nitrogen as an underlayer between a chromium masking layer containing more than 25% by atomic ratio of nitrogen (or a chromium masking layer containing in addition to more than 25% by atomic ratio of nitrogen, boron or carbon as the third component) and a transparent substrate, and forming a chromium oxide antireflection layer containing more than 25% by atomic ratio of nitrogen on the chromium masking layer.

Photomask blanks and photomasks having particularly excellent chemical resistance can be obtained by adjusting the nitrogen content in each of the layers formed on the substrate to a level of from more than 25 to 50% by atomic ratio. Further, by adjusting the compositions and construction of the layers as mentioned above, it is possible to increase the adhesion of the chromium masking layer to the glass substrate. By using the photomask blanks of the present invention, the remainder of chromium at the end point of etching for patternizing can be minimized. Furthermore, the final stage of the etching is a treatment of the underlayer composed of a chromium thin layer containing nitrogen where the etching speed is high, whereby the etching end point can easily be determined. This is an advantage obtainable simultaneously with the foregoing advantages.

According to the present invention, the overhang can remarkably be reduced by incorporating a nitrogen component into the antireflection layer composed of chromium oxide, particularly by incorporating from more than 25 to 40% by atomic ratio of nitrogen. Accordingly, by using such a layer composition, it is possible to form a pattern with high precision, which makes it possible to present a high quality photomask such as a photomask for VLSI.

Further, according to the present invention, the acid resistance can remarkably be improved by incorporating a nitrogen component into the chromium masking layer, particularly by incorporating from more than 25 to 50% by atomic ratio of nitrogen, whereby it is possible to make the layer almost insoluble in a strong acid.

When a chromium layer having such high acid resistance is used as chromium masking layer for a photomask blank or a photomask, it is possible to clean it with a strong acid even when a dust from the air is deposited or a stain during the handling is attached thereon, and the layer will not substantially be damaged by repeated cleaning operations, such being very advantageous. Particularly in the exposure process of silicon wafers, photomasks are likely to be stained, and it is particularly advantageous to maintain an expensive high precision mask pattern by cleaning.

As described in the foregoing, according to the present invention, it is possible to provide photomasks and photomask blanks satisfying various properties required for the photomasks or photomask blanks simultaneously.

What is claimed is:

1. A photomask blank comprising a transparent substrate and at least two layers including a masking layer and an antireflection layer, formed thereon, wherein said masking layer is a chromium masking layer containing from more than 25% to not more than 50% by atomic ratio of nitrogen, and said antireflection layer is a chromium oxide antireflection layer containing from more than 25% to not more than 40% by atomic ratio of nitrogen.

2. The photomask blank according to claim 1, wherein the chromium masking layer contains boron or carbon.

3. The photomask blank according to claim 1, wherein the chromium masking layer contains from 1 to 20% by atomic ratio of boron, or from 5 to 30% by atomic ratio of carbon.

4. The photomask blank according to claim 2, wherein a chromium layer containing more than 25% by atomic ratio of nitrogen is formed on the transparent substrate, as an under layer beneath the chromium masking layer.

5. The photomask blank according to claim 4, wherein the under layer has a thickness of from 50 to 300 Å.

6. The photomask blank according to claim 1, wherein the antireflection layer is formed on the transparent substrate and beneath the chromium masking layer, and another antireflection layer is formed on the chromium masking layer.

7. A photomask comprising a transparent substrate and at least two patternized layers including a patternized masking layer and a patternized antireflection layer, formed thereon, wherein said masking layer is a chromium masking layer containing from more than 25% to not more than 50% by atomic ratio of nitrogen, and said antireflection layer is a chromium oxide antireflection layer containing from more than 25% to not more than 40% atomic ratio of nitrogen.

8. The photomask according to claim 7, wherein the chromium masking layer contains boron or carbon.

9. The photomask according to claim 7, wherein the chromium masking layer contains from 1 to 20% by atomic ratio of boron, or from 5 to 30% by atomic ratio of carbon.

10. The photomask according to claim 8, wherein a chromium layer containing more than 25% by atomic ratio of nitrogen is formed on the transparent substrate, as an under layer beneath the chromium masking layer.

11. The photomask according to claim 10, wherein the under layer has a thickness of from 50 to 300 Å.

12. The photomask according to claim 7, wherein the antireflection layer is formed on the transparent substrate and beneath the chromium masking layer, and another antireflection layer is formed on the chromium masking layer.

* * * * *